(12) United States Patent
Demange et al.

(10) Patent No.: US 10,881,018 B2
(45) Date of Patent: Dec. 29, 2020

(54) FLOOR-LOADING LOAD-SPREADING SYSTEM FOR COMPUTER CABINET

(71) Applicant: BULL SAS, Les Clayes-sous-Bois (FR)

(72) Inventors: Fabien Demange, Poissy (FR); Luc Dallaserra, Paris (FR)

(73) Assignee: BULL SAS, Les Clayes-sous-Bois (FR)

( * ) Notice: Subject to any disclaimer, the term of this patent is extended or adjusted under 35 U.S.C. 154(b) by 5 days.

(21) Appl. No.: 16/312,734

(22) PCT Filed: Jun. 29, 2017

(86) PCT No.: PCT/FR2017/051743
§ 371 (c)(1),
(2) Date: Dec. 21, 2018

(87) PCT Pub. No.: WO2018/002532
PCT Pub. Date: Jan. 4, 2018

(65) Prior Publication Data
US 2019/0332148 A1    Oct. 31, 2019

(30) Foreign Application Priority Data
Jul. 1, 2016    (FR) ..................................... 16 56322

(51) Int. Cl.
*G06F 1/18* (2006.01)
*H05K 7/14* (2006.01)

(52) U.S. Cl.
CPC .................................. *H05K 7/1488* (2013.01)

(58) Field of Classification Search
CPC ................ H05K 7/1488; A47B 47/045; A47B 47/0008; A47B 47/0016; A47B 47/0058; A47B 47/0083
See application file for complete search history.

(56) References Cited

U.S. PATENT DOCUMENTS 3,901,612 A * 8/1975 Canin ..................... F16B 7/187
                                               403/189
4,490,064 A * 12/1984 Ducharme ......... A47B 47/0008
                                               403/255

(Continued)

FOREIGN PATENT DOCUMENTS

EP        1 701 602 A1     9/2006

OTHER PUBLICATIONS

International Preliminary Report on Patentability and the Written Opinion of the International Searching Authority as issued in International Patent Application No. PCT/FR2017/051743, dated Jan. 1, 2019.

(Continued)

*Primary Examiner* — Matthew W Ing
(74) *Attorney, Agent, or Firm* — Pillsbury Winthrop Shaw Pittman LLP (57) ABSTRACT

A device for spreading the floor-loading of a computer cabinet includes a bottom, an external face of which is to be positioned facing the floor. The external face of the bottom of the cabinet includes pins, each pin including at its end furthest from the bottom a head the diameter of which is greater than the diameter of a shank of the pin, the shank providing the connection between the cabinet and the pin, the load-spreading device includes at least two beams, each beam including at least two parallel flat faces: a first face includes a slot acting as a rail, the width of the slot being greater than the diameter of a pin shank but less than the diameter of a pin head, this slot collaborating with at least two pins for the installation of the beam, a second face is in contact with the floor.

10 Claims, 5 Drawing Sheets

(56) References Cited

U.S. PATENT DOCUMENTS

| | | | | |
|---|---|---|---|---|
| 5,036,634 A | * | 8/1991 | Lessard | E04H 1/1205 |
| | | | | 446/105 |
| 5,580,181 A | * | 12/1996 | Nomura | A47B 47/0016 |
| | | | | 403/170 |
| 6,179,398 B1 | * | 1/2001 | Martin | A47B 47/0008 |
| | | | | 312/223.1 |
| 10,206,506 B1 | * | 2/2019 | Lai | A47B 96/1433 |
| 10,501,928 B2 | * | 12/2019 | Pfeiffer | A47B 47/02 |
| 2008/0006596 A1 | * | 1/2008 | Palmeri | A47B 47/0016 |
| | | | | 211/189 |
| 2008/0218948 A1 | * | 9/2008 | Lai | H05K 5/0234 |
| | | | | 361/724 |
| 2013/0021733 A1 | * | 1/2013 | Demange | H05K 7/1497 |
| | | | | 361/679.02 |
| 2019/0116972 A1 | * | 4/2019 | Tao | A47B 47/005 |

OTHER PUBLICATIONS

International Search Report as issued in International Patent Application No. PCT/FR2017/051743, dated Oct. 13, 2017.

\* cited by examiner

FLOOR-LOADING LOAD-SPREADING SYSTEM FOR COMPUTER CABINET

CROSS REFERENCE TO RELATED APPLICATIONS

This application is the U.S. National Stage of PCT/FR2017/051743, filed Jun. 29, 2017, which in turn claims priority to French Patent Application No. 1656322 filed Jul. 1, 2016, the entire contents of all applications are incorporated herein by reference in their entireties.

TECHNICAL FIELD OF THE INVENTION

The object of the invention is a ground load distribution device for a computer cabinet.

The present invention relates to a mechanical system enabling the ground load distribution of computer cabinets to be optimised and thus local stresses applied to raised floors in data centres to be reduced.

A data centre is also called a server farm.

STATE OF PRIOR ART

A server farm is conventionally a room in which a plurality of computer cabinets is installed. These cabinets are organised in rows, each row being comprised of adjoining cabinets. Such a room includes a raised floor on which the cabinets are laid. Cables or pipes come out through the floors of the cabinets and circulate under the raised floor of the room.

For their placement, the cabinets are moved by being rolled. The outer face of a floor of a cabinet integrates four peripheral castors.

Once a computer cabinet is positioned in the room, a conventional ground anchoring system is made with plunger cylinders located under the cabinet ensuring stabilisation as well as load transmission to the raised floor. Such a plunger cylinder is, conventionally, a threaded shank introduced in a tapped part of the cabinet floor and including a wedge at its end.

This system conventionally used up to now thus consists in placing retractable plunger cylinders under the computer cabinet. These plunger cylinders are in the four corners at minimum and sometimes more in number as a function of the load to be supported.

Once the cabinet is brought on its castors to the final location, the cabinet plunger cylinders are manually lowered one by one to contact the ground until the castors scarcely get off the ground. The cabinet is then stable.

This conventional system has some limitations, in particular when the weight of the cabinets increases beyond 1 500 kg. Indeed:

the weight of the computer cabinet is transmitted to the raised floor through the plunger cylinders, thus representing very small ground anchoring areas. That raises problems of punching the raised floor slabs when the computer cabinet weight increases and requires a very strong increase in the slab resistance in data centres.

The raised floor class cannot be indefinitely increased to further resist to load which would be invalidating for buildings in modern systems including heavy computer cabinets.

When the cabinets have other widths than those of the raised floor slabs (600 nm being the most common), the plunger cylinders located in the corners of the cabinets are no longer in the corners of the slabs. Since the corners of the slabs are the places supported by the pillars of the raised floor structure and are thus the most likely to support the load, having computer cabinets with different widths shifts stress concentrations in the raised floor outside the most rigid and resistant zones, which becomes a real problem.

Increasing the number of plunger cylinders under the cabinet is difficult or even impossible for accessibility reasons. Given that the cabinets stick to each other in the rows of data centres, only the front and rear faces of a rack already in place are accessible, which restricts possible placements for the plunger cylinders. This problem is further enhanced when it is desired to keep the possibility of withdrawing a cabinet independently of the others in the row.

DISCLOSURE OF THE INVENTION

The principle of the invention consists in creating a removable mechanical structure placed between the cabinet floor and the ground. This structure, in a preferred 8-shaped alternative, is made with beams enabling that ground load transmission area to be increased while moving more readily closer to the most rigid zones of the raised floor than with a conventional system of plunger cylinders.

The load distribution system is thus, in one alternative, a system consisting in of 5 beams, the cross-section of which can vary as a function of the weight of the computer cabinet, which will be directly assembled in the cabinet installation room. An installation procedure in the 5-beam alternative consists in lifting the cabinet using a lifting tool and sliding in a predefined order the different beams under the cabinet and finally securing them to each other by screws.

The beams are, for example, made via an aluminium extrusion profile and have a structure with crosses ensuring its mechanical strength under the cabinet weight. The beams include a slot on top of the profile. That enables the beams to be slid in pins crimped in the bottom of the computer cabinet and thus to fix them to the structure of the cabinet. It facilitates mounting as well as a distributed load transmission between the structure of the computer cabinet and the load distribution system.

The system according to the invention is compatible with the positions of the castors placed under the cabinet as well as with the cable or pipe outlets to the technical zone of the raised floor of the cabinet installation room.

Besides the advantages of increased contact area, the system according to the invention also enables loads viewed from the different rigid zones of the raised floor (reinforcing legs) to be averaged by making use in particular of the centre legs under the cabinets which are less biased in the case of a cabinet with plunger cylinders.

For that purpose, one aspect of the invention relates to a ground load distribution device for a computer cabinet including a floor an outer face of which is for being positioned facing the ground characterised in that:

the outer face of the cabinet floor includes a plurality of pins each pin including at its farthest end from the floor a head the diameter of which is higher than the diameter of a shank of the pin, said shank and head providing connection between the cabinet and the pin, the load distribution device includes at least two beams, each beam including at least two parallel planar faces:
a first face includes a slot acting as a rail, the width of the slot being higher than the diameter of a pin shank but lower than the diameter of a pin head, this slot cooperating with at least two pins for the placement of the beam, a second face is in contact with the ground, once the beams are placed, the cabinet weight is distributed on the second surfaces of the beams.

Besides the main characteristics just mentioned in the previous paragraph, the method/device according to the invention can have one or more several complementary characteristics from the following ones, considered singly or according to any technically possible combinations:

the inner structure of a beam is a cross;

for rigidifying the device:
- a first beam includes, integrated at its inner structure, and at one of the ends of the beam a tapped part,
- a second beam includes, on the faces other than those in contact with the ground or the cabinet, a through hole for passing a cap screw therethrough enabling the first and second beams to be secured, the cap screw being screwed in the tapped part;

the through hole is oblong in a direction corresponding to the largest dimension of the beam;

the height of a beam is such that once the beam is placed, castors of the cabinet are no longer in contact with the ground;

the device includes five beams:
- four of them forming a rectangular parallelepiped corresponding to the perimeter of the cabinet floor,
- the fifth joining two parallel edges of the parallelepiped together,
- cap screws securing the beams forming the parallelepiped being introduced via the faces of the beams corresponding to the front and rear faces of the cabinet.

BRIEF DESCRIPTION OF THE FIGURES

Further characteristics and advantages of the invention will appear upon reading the description that follows, in reference to the appended figures, which illustrate:

FIG. 1.a: a bottom view of a cabinet according to the invention, the figure is not to scale;

FIG. 1.b: a side view of a cabinet according to the invention, the figure is not to scale;

FIG. 2.a: a transverse cross-section view of a beam used in a load distribution device according to the invention;

FIG. 2.b: a transverse cross-section view of a beam used in a load distribution device according to the invention, the cross-section being made at a side hole of the beam;

FIG. 2.c: a perspective view of a beam used in a load distribution device according to the invention;

FIG. 4.a: a schematic representation of the placement of a first beam;

FIG. 4.b: a schematic representation of the placement of a second beam;

FIG. 4.c: a schematic representation of the placement of a third beam and a fourth beam;

FIG. 4.d: a schematic representation of the placement of a fifth beam.

For the sake of clarity, identical or similar elements are marked with identical reference signs throughout the figures.

The invention will be better understood upon reading the description that follows and upon examining the accompanying figures. These are shown by way of indicating and in no way limiting purposes of the invention.

DETAILED DESCRIPTION OF ONE EMBODIMENT

Figure 1:
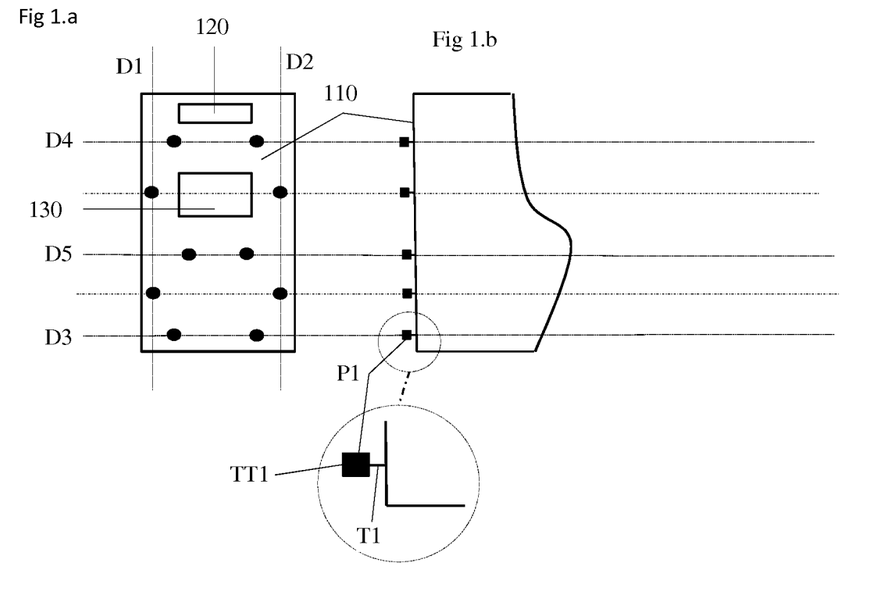

FIG. 1.a shows an outer face of the floor of a cabinet including a device according to the invention. The face is referred to as the outer face because it is for being positioned facing the ground. The 110 cabinet floor forms a rectangular quadrilateral.

FIG. 1.a shows that the outer face 110 of the floor includes two technical apertures enabling cables and other means, for example pipes enabling a coolant to be circulated, to pass therethrough.

A first technical aperture 120 is located in the proximity of the rear of the cabinet. A second technical aperture 130 is located in the proximity of the centre of the cabinet floor.

FIG. 1.a shows that, in this alternative, the outer face 110 includes ten pins. The pins are disposed in pairs thus defining five straight lines which correspond to positions of beams of a load distribution device according to the invention.

These five straight lines are defined as a function of technical apertures in the cabinet floor 110, such that they do not pass through these apertures.

Each of these five straight lines is parallel to at least one of the sides of the quadrilateral formed by the cabinet floor.

In the alternative of the invention represented, four of the five straight lines, the first straight line D1, the second straight line D2, the third straight line D3 and the fourth straight line D4 are located at the edge of the cabinet floor by meeting the following requirements:

the distance between the edge of the cabinet floor and the straight line corresponding to a half-width of a beam of a load distribution device according to the invention. Thus, once the beam is placed, it does not increase the ground area of the cabinet.

The straight lines do not pass through technical apertures. Thus, by applying these requirements, the fourth straight line D4 passes between the first and second technical apertures.

The fifth straight line D5 is parallel to the fourth straight line D4 and located on the other side of the second technical aperture relative to the fourth straight line D4. Ideally, this fifth straight line D5 is located as close as possible to the vertical of a centre of mass of the cabinet, the cabinet being considered as full. A full cabinet is a cabinet in which all the computer equipment it should accommodate has been installed.

FIG. 1.b shows an external side view of the cabinet in particular at its floor. In particular, FIG. 1.b illustrates that a pin includes:

a shank T1 attached to the cabinet floor, a head TT1 integral with the shank T1 at the end of the shank T1 opposite to that attached to the cabinet floor.

The diameter of the head TT1 is higher than the diameter of the shank T1.

All the pins are identical as regards their structure.

Figure 2:
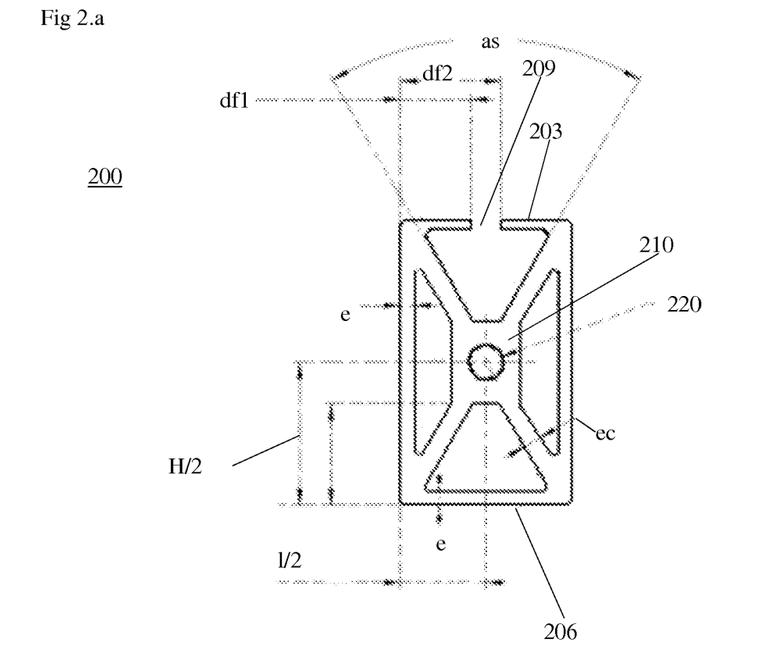

FIG. 2.a shows a transverse cross-section of a main beam 220 used in a load distribution device according to the invention.

FIG. 2.a shows that the cross-section of the beam is rectangular. In the exemplary embodiment illustrated, the beam has a height H of 62 mm for a width I of 37 mm. The two side walls and the lower wall have a thickness e of 3 mm.

FIG. 2.*a* shows that the beam includes an inner structure forming a cross with four branches, each branch extending from an internal corner of the beam to an inner beam 210 with the same height/width proportion as the beam itself. The crosses have a thickness ec of 4 mm. The inner beam has a height of 18 mm. FIG. 2.*a* shows that an upper face 203 of the beam includes a slot 209 with a width of 6.5 mm. The distance df1 between a side of the beam and a first edge of the slot is 15.25 mm. The distance df2 between said side of the beam and a second edge of the slot is 21.75 mm. The face opposite to the upper face 203 is the lower face 206. The upper and lower faces are parallel.

FIG. 2.*a* shows that both upper crosses of the inner structure of the beam form an angle as of 60° with each other.

FIG. 2.*a* shows that the inner beam 210 includes, at least in the proximity of an edge of the main beam, a tapped part 220 including the axis in the direction in which the main beam extends. It is the direction along which the length of the main beam is measured. In the embodiment represented, the tapped part 220 has a diameter of 6.8 mm.

Thus configured, the slot and the pins form a suspension system on the principle of that known as a T-groove.

FIG. 2.*b* shows a transverse cross-section view of the beam 300 at a side hole. For a main beam, a side hole actually includes three coaxial holes:
 a first hole 230 in a first side wall of the main beam;
 a second hole 240 in the centre beam;
 a third hole 250 in a second side wall of the main beam having a diameter identical to that of the first hole.

The diameter of the second hole is such that it enables a cap screw for being screwed in the tapped part 220 to pass therethrough, that is a diameter at least equal, in the example described, to 6.8 mm. This diameter is lower than the diameter of the head of such a cap screw.

The diameter of the first hole is such that it enables the head of the cap screw mentioned in the previous paragraph to pass therethrough.

In one alternative of the invention, a side hole is circular. In another alternative, a circular hole is oblong to enable positions of the beam to be adjusted.

FIG. 2.*c* shows a beam used in a load distribution device according to the invention. FIG. 2.*c* shows that the inlets of the slot 209 can be bevelled, that is wider than the slot itself, to facilitate the placement of the beam.

Figure 3:
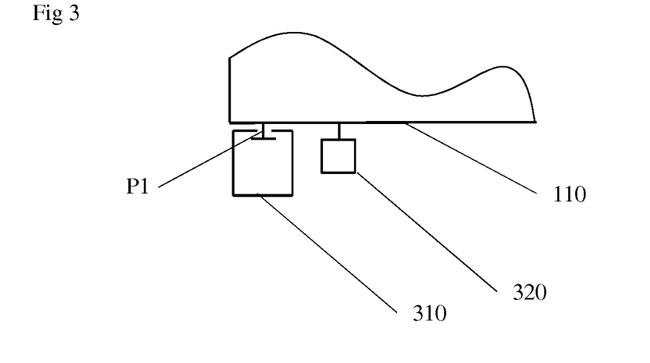
FIG. 3: a detail scheme of the interaction of the invention with a cabinet moving means.

FIG. 3 shows the outer face 110 of the cabinet floor. FIG. 3 shows a beam 310 suspended to a pin P1 of the outer face 110.

FIG. 3 also shows that the outer face 110 includes at least one castor 320. Such a castor enables the cabinet to be moved by rolling it on the ground.

FIG. 3 illustrates that when the load distribution device according to the invention is in place, the castor is no longer in contact with the ground, which means that:
 the cabinet cannot be moved by rolling;
 the castor does not support the cabinet weight any longer.

Figure 4:
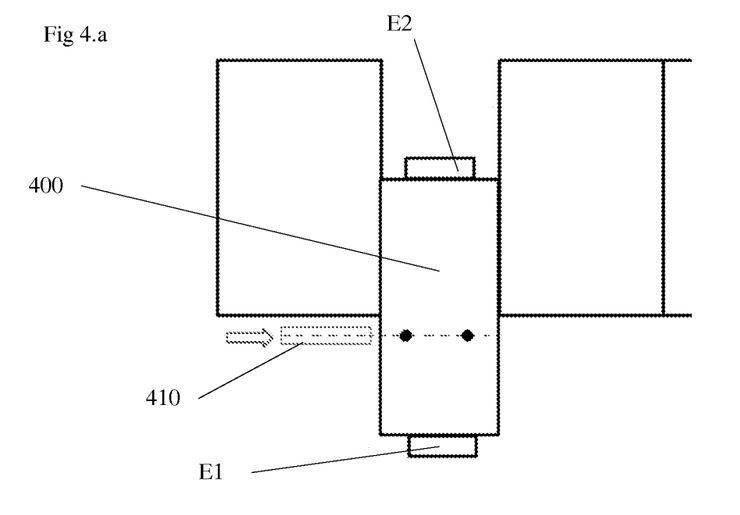

FIG. 4.*a* shows a step of placement of a first beam 410 for the placement of a load distribution device according to the invention on a cabinet 400. The placement of the load distribution device according to the invention is made once the cabinet has got off the ground, that is once its castors are no longer in contact with the ground. It is made, for example, by using two lifts: a first lift F1 fastened to a front face of the cabinet 400, a second lift is fastened to a rear face of the cabinet 400. Both lifts act together. The fact that the lifts are fastened to the front and rear faces leaves free access to the outer face of the cabinet floor.

The first beam is a median beam installed in a centre zone of the cabinet floor. This beam is installed by using the pins forming the fifth straight line.

The length of the first beam is equal to the width of the cabinet 400 minus 2 beam widths.

FIG. 4.*b* shows that once the first beam is placed, the cabinet is moved so as to make the pins realising the fourth straight line accessible from the sides of the cabinet. Once this movement is performed, a second beam 420 is positioned by using the pins realising the fourth straight line.

The second beam has a length equal to the cabinet width.

FIG. 4.*c* shows the placement of a third beam 430 by using the pins realising the first straight line.

FIG. 4.*c* shows the placement of a fourth beam 440 by using the pins realising the second straight line.

The third and fourth beams have lengths identical and such that when they abut against the second beam, a beam width remains between the front of the cabinet and the closest end of the third and fourth beams.

FIG. 4.*c* also shows that once the third and fourth beams are placed, two cap screws are used:
 a first cap screw 422 for securing the second beam with the third beam by using a tapped part of the third beam and a first side hole of the second beam;
 a second cap screw 424 for securing the second beam with the fourth beam by using a tapped part of the fourth beam and a second side hole of the second beam.

FIG. 4.*d* shows that the cabinet is moved such that the pins realising the third straight line and the tapped parts of the first beam are accessible.

FIG. 4.*d* shows the placement of a fifth beam 450 by using the pins realising the third straight line.

The fifth beam has a length identical to that of the second beam.

FIG. 4.*d* also shows that once the fifth beam is placed, four cap screws are used:
 a third cap screw (442) for securing the fourth beam to the first beam by using a tapped part of the first beam and a side hole of the fourth beam;
 a fourth cap screw (452) for securing the fifth beam with the fourth beam by using a tapped part of the fourth beam and a first side hole of the fifth beam;
 a fifth cap screw (454) for securing the fifth beam with the third beam by using a tapped part of the third beam and a second side hole of the fifth beam;
 a sixth cap screw (432) for securing the third beam to the first beam by using a tapped part of the first beam and a side hole of the third beam.

Once the cap screws are placed, a rigid 5-beam structure attached to the cabinet is obtained.

For the figures of the series 4, only the elements useful for understanding the method for implementing the device according to the invention have been represented. Thus, from one Fig. to the other, pins and/or cap screws can disappear without meaning whatever regarding them.

Thereby, the cabinet can be placed at its final place and the lifting devices can be withdrawn.

The cabinet thereby rests on this rigid device on which its weight is distributed. The device according to the invention can be placed as close as possible to the cabinet final place and even in a congested room.

It is noted that the use of cap screws is optional. The invention, that is load distribution, is actual without the screws. The latter enable the structure to be rigidified and make it possible to make the transport of an equipped cabinet easier. It is also noted that a cap screw can be sufficient, for example the fourth or the fifth one to ensure irremovability of the load distribution structure.

It is still noted that the presence of a tapped part can enable load distribution systems to be secured to each other by using a piece including two holes, each of the holes corresponding to a side hole of a beam of two neighbouring load distribution devices.

The advantage of this load distribution device for computer cabinets in comparison with the conventional ground anchoring system with plunger cylinders has been demonstrated by mechanical simulations:

in a case of a raised floor modelling, the movements on the raised floor slabs as well as the local stresses have been strongly decreased. That enables the raised floor class necessary to support the systems or possible reinforced parts necessary for supporting the slabs in the places biased to be limited;

to a lesser extent, the loads of the computer cabinets are a little better distributed on the raised floor legs.

The invention claimed is:

1. A ground load distribution device for a computer cabinet including a floor an outer face of which is for being positioned facing the ground wherein:
   the outer face of the cabinet floor includes a plurality of pins, each pin including at its farthest end from the floor, a pin head a diameter of which is higher than the diameter of a pin shank of the pin, said pin shank providing connection between the cabinet and the pin,
   the load distribution device includes at least two beams, each beam including at least two parallel planar faces:
      a first face includes a slot acting as a rail, a width of the slot being higher than a diameter of the pin shank but lower than a diameter of the pin head, the slot cooperating with at least two pins of the plurality of pins for the placement of the beam,
      a second face is in contact with the ground,
   once the beams are placed, the cabinet weight is distributed on the second surfaces of the beams.

2. The load distribution device according to claim 1, wherein an inner structure of a beam is a cross.

3. The load distribution device according to claim 1, wherein:
   a first beam includes, integrated at its inner structure, and at one of the ends of the beam, a tapped part,
   a second beam includes, on the faces other than those in contact with the ground or the cabinet, a through hole for passing a cap screw therethrough enabling the first and second beams to be secured, the cap screw being screwed in the tapped part.

4. The load distribution device according to claim 3, wherein the through hole is oblong in a direction corresponding to the largest dimension of the beam.

5. The load distribution device according to claim 3, comprising five beams:
   four of the five beams forming a rectangular parallelepiped corresponding to the perimeter of the cabinet floor,
   the fifth of the five beams joining two parallel edges of the parallelepiped together,
   cap screws securing the five beams forming the parallelepiped being introduced via the faces of the five beams corresponding to front and rear faces of the cabinet.

6. The load distribution device according to claim 1, wherein a height of a beam is such that once the beam is placed, castors of the cabinet are no longer in contact with the ground.

7. A system comprising a computer cabinet including a floor an outer face of which is for being positioned facing the ground and a ground load distribution device for said computer cabinet, wherein:
   the outer face of the cabinet floor includes a plurality of pins, each pin including at its farthest end from the floor, a pin head a diameter of which is higher than the diameter of a pin shank of the pin, said pin shank providing connection between the cabinet and the pin,
   the load distribution device includes at least two beams, each beam including at least two parallel planar faces:
      a first face includes a slot acting as a rail, a width of the slot being higher than a diameter of the pin shank but lower than a diameter of the pin head, the slot cooperating with at least two pins of the plurality of pins for the placement of the beam,
      a second face is in contact with the ground,
   once the beams are placed, the cabinet weight is distributed on the second surfaces of the beams.

8. The load distribution device according to claim 1, wherein each of the at least two beams forms a rectangular parallelepiped.

9. The load distribution device according to claim 1, wherein the second face is devoid of a longitudinal slot.

10. The load distribution device according to claim 1, wherein the inner structure of a beam includes upper crosses that form an angle of 60° with each other.

* * * * *